US006411232B1

United States Patent
Miller et al.

(10) Patent No.: US 6,411,232 B1
(45) Date of Patent: Jun. 25, 2002

(54) METHOD AND SYSTEM FOR DETERMINING AN ELEMENT CONVERSION CHARACTERISTIC CONTEMPORANEOUS WITH CONVERTING AND INPUT SIGNAL IN A SIGNAL CONVERTER

(75) Inventors: Matthew R. Miller, Palatine; Craig Petrie, Cary; John Rinderknecht, Streamwood, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/409,779

(22) Filed: Sep. 30, 1999

(51) Int. Cl.[7] .................................................. H03M 1/10
(52) U.S. Cl. ........................ 341/120; 341/118; 341/143; 341/144; 341/155; 341/172; 341/122; 341/141
(58) Field of Search .................................. 341/118, 119, 341/120, 143, 140, 155

(56) References Cited

U.S. PATENT DOCUMENTS

| | | | |
|---|---|---|---|
| 4,305,050 A | * 12/1981 | DeFreitas | .................... 341/143 |
| 4,612,654 A | * 9/1986 | DeFreitas | .................... 375/249 |
| 4,897,856 A | 1/1990 | Cukier et al. | |
| 4,943,807 A | 7/1990 | Early et al. | |
| 4,999,625 A | 3/1991 | Thompson | |
| 5,028,924 A | 7/1991 | Thompson | |
| 5,257,026 A | 10/1993 | Thompson et al. | |
| 5,404,142 A | 4/1995 | Adams et al. | |
| 5,561,660 A | 10/1996 | Kotowski et al. | |
| 5,598,157 A | 1/1997 | Kornblum et al. | |
| 5,781,137 A | * 7/1998 | Knudsen | .................... 341/118 |
| 5,781,138 A | 7/1998 | Knudsen | |
| 5,838,272 A | 11/1998 | Steiner et al | |
| 5,838,598 A | 11/1998 | Hurrell | |
| 6,016,112 A | * 1/2000 | Kundsen | .................... 341/118 |
| 6,028,544 A | * 2/2000 | Zarubinsky et al. | ......... 341/143 |
| 6,111,529 A | * 8/2000 | Maulik et al. | .............. 341/120 |
| 6,147,631 A | * 11/2000 | Maulik et al. | .............. 341/122 |

OTHER PUBLICATIONS

A. Abdennadher, et al. (UCLA), "Adaptive self–calibrating delta–sigma modulators," *Electronics Letters*, v.28(14), pp. 1288–1289, Jul. 2, 1992.

M. Sarhang–Nejad and G,C, Temes (UCLA), "A True 16–bit 20 kHz multibit $\Sigma\Delta$ ADC with digital corrections," *Proc. CCIC '92*, pp. 16.4.1–16.4.4, 1992.

(List continued on next page.)

*Primary Examiner*—Michael Tokar
*Assistant Examiner*—Lam T. Moi
(74) *Attorney, Agent, or Firm*—Daniel W. Juffernbruch

(57) ABSTRACT

A converter continuously converts an input signal (110) to an output signal (112) even during correction and compensation. A primary converter (124) converts the signal along a forward primary path (104). A feedback converter (140) along a feedback path (106) outputs a feedback signal (116). A reference device (136) employs reference indicator (134) to provide a digital reference signal (135). A selection device (132) passes the digital reference signal (135) to an element (204) of the feedback converter (140) for outputting reference portion (208) of the feedback signal (116). The passing of the digital reference signal (135) to the element (204) is contemporaneous with the converting of the input signal (110) to the output signal (112). The evaluator (142) determines a conversion characteristic of the element (204) by employing a characteristic of the reference indicator (134).

44 Claims, 8 Drawing Sheets

OTHER PUBLICATIONS

M. Sarhang–Nejad and G,C, Temes (UCLA), "A high–resolution multibit ΣΔ ADC with digital correction and relaxed amplifier requirements." *JSSC,* v. 28, n.6, pp. 648–656, Jun. 1993.

S. Kiaei, et al.(UCLA), "Adaptive digital correction for dual quantization Σ–Δ modulators," *Proc. ISCAS '93,* pp. 1228–1230, 1993.

T. Catelepe and G.C. Temes (UCLA), "Multibit Oversampled Σ–Δ A/D Converter with Digital Error Correction," *Electronics Letters,* v. 24, n. 16, pp. 1051–1052, Aug. 4, 1988.

T. Catelepe, et al. (UCLA), "Digitally corrected multi–bit ΣΔ data converters," *Proc. ISCAS '89,* pp. 647–650, 1989.

W. Groeneveld, et al. (Philips), "A self–calibration technique for monolithic high–resolution D/A converters," JSSC, v.24, n.6, pp. 1517–1522, Dec. 1989.

R.H. Walden, et al. (UCLA), "Architectures for high–order multbit ΣΔ modulators," *Proc. ISCAS '90,* pp. 895–898, 1990.

J.W. Fattruso, et al. (TI), "Self–calibration techniques for a second–order multibit sigma–delta modulator," *JSSC,* v.28, n.12, pp. 1216–1223, Dec. 1993.

C.D. Thompson and S.R. Bernadas (Crystal), "A digitally–corrected 20b delta–sigma modulator," *Proc. ISSCC '94,* pp. 194–195, 1994.

R.T. Baird and T.S. Fiez (WSU), "A low oversampling ration 14–b 500–kHz ΣΔ ADC with a self–calibrated multi–bit DAC." *JSSC,* v.31, N.3, Mar. 1996.

G. Cauwenberghs and G.C. Temes (UCLA), "Adaptive calibration of multiple quantization oversampled A.D converters." *Proc. ISCAS'τ,* pp. 512–515, 1996.

A. Wiesbuer and G.C. Temes (Oregon State), "On–line digital compensation of analog circuit imperfections for cascaded SD modulators," *Proc. 1996 IEE–CAS Region 8 Workshop on Analog and Mixed IC Design,* pp. 92–97, 1996.

K.Y. Leung, et al. (Crystal), "A 5V, 118dB ΣΔ analog–to–digital converter for wideband digital audio," *Proc. ISSCC 'Y,* pp. 218–219, 1997.

* cited by examiner

| TIME | SIGNAL 110 | SIGNAL 118 | SIGNAL 122 | SIGNAL 130 | SIGNAL 116 | INDICATOR 134 | VALUE 144 |
|---|---|---|---|---|---|---|---|
| 0 | 0.00 | −0.48 | 0.00 | 0 | 0.48 | 1 | 0.00 |
| 1 | 0.11 | 0.59 | 0.00 | 0 | −0.48 | −1 | 0.00 |
| 2 | 0.22 | −0.28 | −0.48 | 0 | 0.48 | 1 | 0.33 |
| 3 | 0.33 | −0.19 | 0.59 | 1 | 0.52 | −1 | 0.50 |
| 4 | 0.44 | 0.99 | −0.74 | −1 | −0.52 | 1 | 0.50 |
| 5 | 0.53 | 1.01 | 0.40 | 0 | −0.48 | −1 | 0.40 |
| 6 | 0.63 | 0.15 | 0.22 | 0 | 0.48 | 1 | 0.29 |
| 7 | 0.71 | 0.19 | 1.42 | 1 | 0.52 | −1 | 0.48 |
| 8 | 0.78 | 0.30 | 0.37 | 0 | 0.48 | 1 | 0.38 |
| 9 | 0.85 | −0.67 | 1.61 | 2 | 1.52 | −1 | 0.56 |
| 10 | 0.90 | −0.58 | 0.67 | 1 | 1.48 | 1 | 0.40 |
| 11 | 0.95 | 0.43 | 0.94 | 1 | 0.52 | −1 | 0.46 |
| 12 | 0.98 | 0.50 | 0.09 | 0 | 0.48 | 1 | 0.42 |
| 13 | 0.99 | 0.47 | 1.38 | 1 | 0.52 | −1 | 0.46 |
| 14 | 1.00 | −0.48 | 0.59 | 1 | 1.48 | 1 | 0.38 |
| 15 | 0.99 | −0.53 | 1.84 | 2 | 1.52 | −1 | 0.47 |
| 16 | 0.97 | 0.49 | 0.11 | 0 | 0.48 | 1 | 0.44 |
| 17 | 0.94 | 0.42 | 1.31 | 1 | 0.52 | −1 | 0.47 |
| 18 | 0.90 | −0.58 | 0.60 | 1 | 1.48 | 1 | 0.39 |
| 19 | 0.84 | −0.63 | 1.73 | 2 | 1.52 | −1 | 0.47 |
| 20 | 0.77 | 0.29 | 0.02 | 0 | 0.48 | 1 | 0.45 |
| 21 | 0.70 | 0.18 | 1.05 | 1 | 0.52 | −1 | 0.48 |
| 22 | 0.61 | 0.13 | 0.31 | 0 | 0.48 | 1 | 0.45 |
| 23 | 0.52 | 0.00 | 1.23 | 1 | 0.52 | −1 | 0.48 |
| 24 | 0.42 | −0.06 | 0.45 | 1 | 0.48 | 1 | 0.48 |
| 25 | 0.32 | −0.20 | 1.23 | 1 | 0.52 | −1 | 0.48 |
| 26 | 0.21 | −0.27 | 0.39 | 0 | 0.48 | 1 | 0.46 |
| 27 | 0.10 | −0.42 | 1.08 | 1 | 0.52 | −1 | 0.48 |
| 28 | −0.02 | −0.50 | 0.12 | 0 | 0.48 | 1 | 0.48 |
| 29 | −0.13 | −0.85 | 0.61 | 1 | 0.52 | −1 | 0.48 |
| 30 | −0.24 | −0.72 | −0.38 | 0 | 0.48 | 1 | 0.47 |
| 31 | −0.35 | 0.13 | −0.04 | 0 | −0.48 | −1 | 0.45 |
| 32 | −0.45 | 0.07 | −1.09 | −1 | −0.52 | 1 | 0.47 |
| 33 | −0.55 | −0.07 | 0.09 | 0 | −0.48 | −1 | 0.45 |
| 34 | −0.64 | −0.12 | −1.02 | −1 | −0.52 | 1 | 0.47 |
| 35 | −0.72 | −0.24 | 0.03 | 0 | −0.48 | −1 | 0.45 |
| 36 | −0.79 | −0.27 | −1.14 | −1 | −0.52 | 1 | 0.47 |
| 37 | −0.88 | −0.38 | −0.21 | 0 | −0.48 | −1 | 0.46 |
| 38 | −0.91 | −0.39 | −1.42 | −1 | −0.52 | 1 | 0.47 |
| 39 | −0.95 | 0.53 | −0.59 | −1 | −1.48 | −1 | 0.44 |
| 40 | −0.98 | 0.54 | −1.81 | −2 | −1.52 | 1 | 0.48 |
| 41 | −1.00 | −0.52 | −0.06 | 0 | −.048 | −1 | 0.46 |
| 42 | −1.00 | 0.48 | −1.27 | −1 | −.052 | 1 | 0.48 |
| 43 | −0.99 | 0.49 | −0.58 | −1 | −1.49 | −1 | 0.44 |
| 44 | −0.97 | 0.55 | −1.75 | −2 | −1.52 | 1 | 0.48 |
| 45 | −0.94 | −0.45 | −0.09 | 0 | −0.48 | −1 | 0.47 |
| 46 | −0.98 | −0.37 | −1.19 | −1 | −0.52 | 1 | 0.48 |
| 47 | −0.63 | 0.66 | −0.54 | −1 | −1.48 | −1 | 0.45 |

*FIG.5* 500

METHOD AND SYSTEM FOR DETERMINING AN ELEMENT CONVERSION CHARACTERISTIC CONTEMPORANEOUS WITH CONVERTING AND INPUT SIGNAL IN A SIGNAL CONVERTER

FIELD OF THE INVENTION

The present invention relates generally to signal converters and, in particular, to determining a conversion characteristic of a converter element in a signal converter.

BACKGROUND OF THE INVENTION

As is known in the art, a signal converter such as a sigma-delta modulator converts an analog input signal to a digital output signal. Typically, the sigma-delta modulator includes an input, a primary path, a feedback path, and an output. Along the primary path of the sigma-delta modulator are one or more arithmetic devices, a noise-shaping filter, and a primary analog-to-digital converter. The primary analog-to-digital converter employs a sampling clock having a frequency greater than the bandwidth of the analog input signal, per an oversampling ratio. Along the feedback path of the analog-to-digital converter are one or more feedback digital-to-analog converters.

Improvement in the resolution of the digital output signal of the sigma-delta modulator is significantly limited by the degree of non-linearity in the feedback digital-to-analog converter. Non-linearity in the feedback digital-to-analog converter commonly arises from imperfection in one or more converter elements which comprise the feedback digital-to-analog converter. In addition, changes in environmental conditions can adversely affect accuracy of the digital-to-analog signal conversion by the converter elements.

In one example of a sigma-delta modulator, there is no measurement of actual performance of digital-to-analog signal conversion by the elements of the feedback digital-to-analog converter. This design suffers a shortcoming of not accounting for imperfection and/or mismatch among the converter elements. A further shortcoming of this design is the failure to account for environmental conditions which adversely affect performance of the sigma-delta modulator.

Another example of a sigma-delta modulator employs a technique of noise-shaped dynamic element matching. The technique involves using a different subset of converter elements in the feedback digital-to-analog converter for each digital code to be converted to analog form. Each subset of converter elements is chosen so that most of the noise spectrum generated by the inaccurate elements is outside the band of the analog input signal. One shortcoming of this design is that the achievable linearity is limited by inaccuracy in the original matching of converter elements of the feedback digital-to-analog converter. A further shortcoming is the requirement of a substantial amount of circuitry between the output from the primary analog-to-digital converter and the input to the feedback digital-to-analog converter. The additional circuitry is required to switch among the subsets of converter elements corresponding to each digital code to be convened. The amount of circuitry required increases substantially with the number of elements in the feedback path. The addition of circuitry undesirably causes delay in the feedback path. This additional delay adversely affects the stability of continuous-time sigma-delta modulators and ultimately limits the sampling rate of either continuous- or discrete-time sigma-delta modulators.

As yet another shortcoming, the technique is less effective if the oversampling ratio of the primary analog-to-digital converter is less than thirty-two, thereby undesirably introducing a limit on the overall bandwidth of the sigma-delta modulator in view of the cost of providing an increase in the frequency of the sampling clock.

A further example of a sigma-delta modulator temporarily halts the basic conversion of the input signal to the output signal in the sigma-delta modulator to perform a calibration of the converter elements of the feedback digital-to-analog converter. A shortcoming of this design is the requirement of interrupting the basic operation by the sigma-delta modulator of converting the input analog signal to the output digital signal whenever calibration of any converter element of the feedback digital-to-analog converter takes place. Another shortcoming is the failure to correct for environmental changes arising at times between calibrations of the converter elements of the feedback digital-to-analog converter.

Thus, a need exists for determination of a conversion characteristic of a converter element contemporaneous with conversion of an input signal to an output signal converter.

BRIEF DESCRIPTION OF THE DRAWINGS

FIG. 5 is a table of values over a time interval for various locations in the sigma-delta modulator of FIG. 1 in accordance with the invention.

DETAILED DESCRIPTION OF THE PREFERRED EMBODIMENTS

The invention encompasses a method of converting an input signal to an output signal across a primary path of a signal converter. A primary converter along the primary path outputs a return signal to a feedback path of the signal converter. A feedback converter along the feedback path outputs a feedback signal to the primary path. A reference indicator is employed to provide a reference signal. The reference signal is passed to an element of the feedback converter for outputting a reference portion of the feedback signal contemporaneous with the converting of the input signal to the output signal. A conversion characteristic of the element is determined by employing a characteristic of the reference indicator.

Another embodiment of the invention encompasses a system used in converting an input signal to an output signal across a primary path of a signal converter. The signal converter has a primary converter along the primary path which outputs a return signal to a feedback path of the signal converter and a feedback converter along the feedback path which outputs a feedback signal to the primary path. A reference device employs a reference indicator to provide a reference signal. A selection device passes the reference signal to an element of the feedback converter for outputting a reference portion of the feedback signal contemporaneous with the converting of the input signal to the output signal. An evaluator determines a conversion characteristic of the element by employing a characteristic of the reference indicator.

Figure 1:
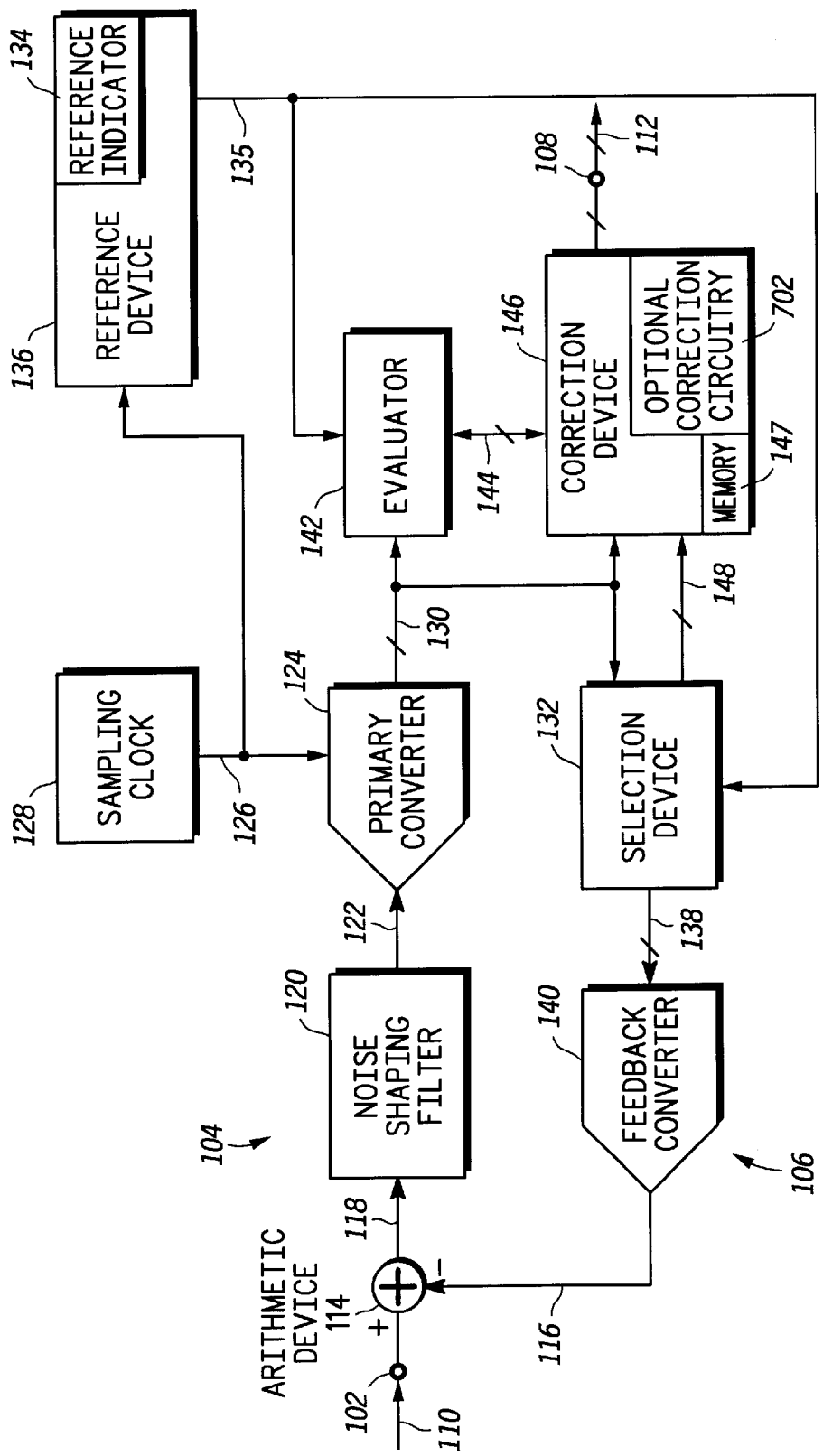
FIG. 1 is a block diagram showing a signal converter as a sigma-delta modulator in accordance with the invention.

Referring to FIG. 1, a signal converter illustrated as sigma-delta modulator 100 includes input port 102, primary conversion path 104, feedback path 106, and output port 108. Sigma-delta modulator 100 converts analog input signal 110 received by input port 102 to digital output signal 112. Digital output signal 112 is transmitted from output port 108.

Still referring to FIG. 1, analog input signal 110 received by input port 102 is input to arithmetic device 114. Also, arithmetic device 114 receives analog feedback signal 116 from feedback path 106. Arithmetic device 114 outputs analog difference signal 118 to noise-shaping filter 120. Analog difference signal 118 output from arithmetic device 114 comprises the arithmetic difference between analog input signal 110 and analog feedback signal 116. Noise-shaping filter 120 which receives difference signal 118 is designed to have high gain in a signal bandwidth of interest and low gain outside the signal bandwidth of interest. In one example, noise-shaping filter 120 has high gain at the frequency of analog input signal 110. For instance, noise-shaping filter 120 can comprise an integrator, as will be understood by those skilled in the art.

Referring further to FIG. 1, noise-shaping filter 120 outputs shaped analog signal 122 to primary analog-to-digital converter 124. Primary analog-to-digital converter 124 also receives clock signal 126 from sampling clock 128. Sampling clock 128 provides clock signal 126 having a higher frequency than the bandwidth of input analog signal 110. The ratio of the frequency of the clock signal 126 to the bandwidth of analog input signal 110 comprises an over-sampling ratio. Primary analog-to-digital converter 124 employs clock signal 126 to obtain multiple samples of analog input signal 110 to generate multiple instances of multi-bit digital signal 130, as will be appreciated by those skilled in the art.

Referring again to FIG. 1, multi-bit digital signal 130 is received by selection device 132 in feedback path 106 as a return signal. Selection device 132 also receives reference signal 135 from reference device 136. Reference device 136 receives clock signal 126 from sampling clock 128. Also, reference device 136 accesses reference indicator 134. For instance, reference indicator 134 can comprise a modulating sequence that reference device 136 applies to generate reference signal 135 at the rate of clock signal 126, as will be appreciated by those skilled in the art.

Further referring to FIG. 1, selection device 132 employs reference signal 135 and multi-bit digital signal 130 in outputting intermediate multi-bit signal 138 to feedback digital-to-analog converter 140. As described herein, selection device 132 selects at least one converter element 204 (FIG. 2) of feedback digital-to-analog converter 140 for determination by evaluator 142 of a conversion characteristic of at least one converter element 204. For instance, the conversion characteristic can comprise a calibration value for at least one converter element 204. In one example, intermediate multi-bit signal 138 includes reference signal 135 for use in calibrating the converter element 204 by evaluator 142. Further, intermediate multi-bit signal 138 includes return portion 205 (FIG. 2) of the return signal comprising multi-bit digital signal 130 to be converted to analog form by feedback digital-to-analog converter 140 in feedback path 106. In another example, feedback path 106 includes multiple instances of digital-to-analog feedback converter 140.

Figure 2:
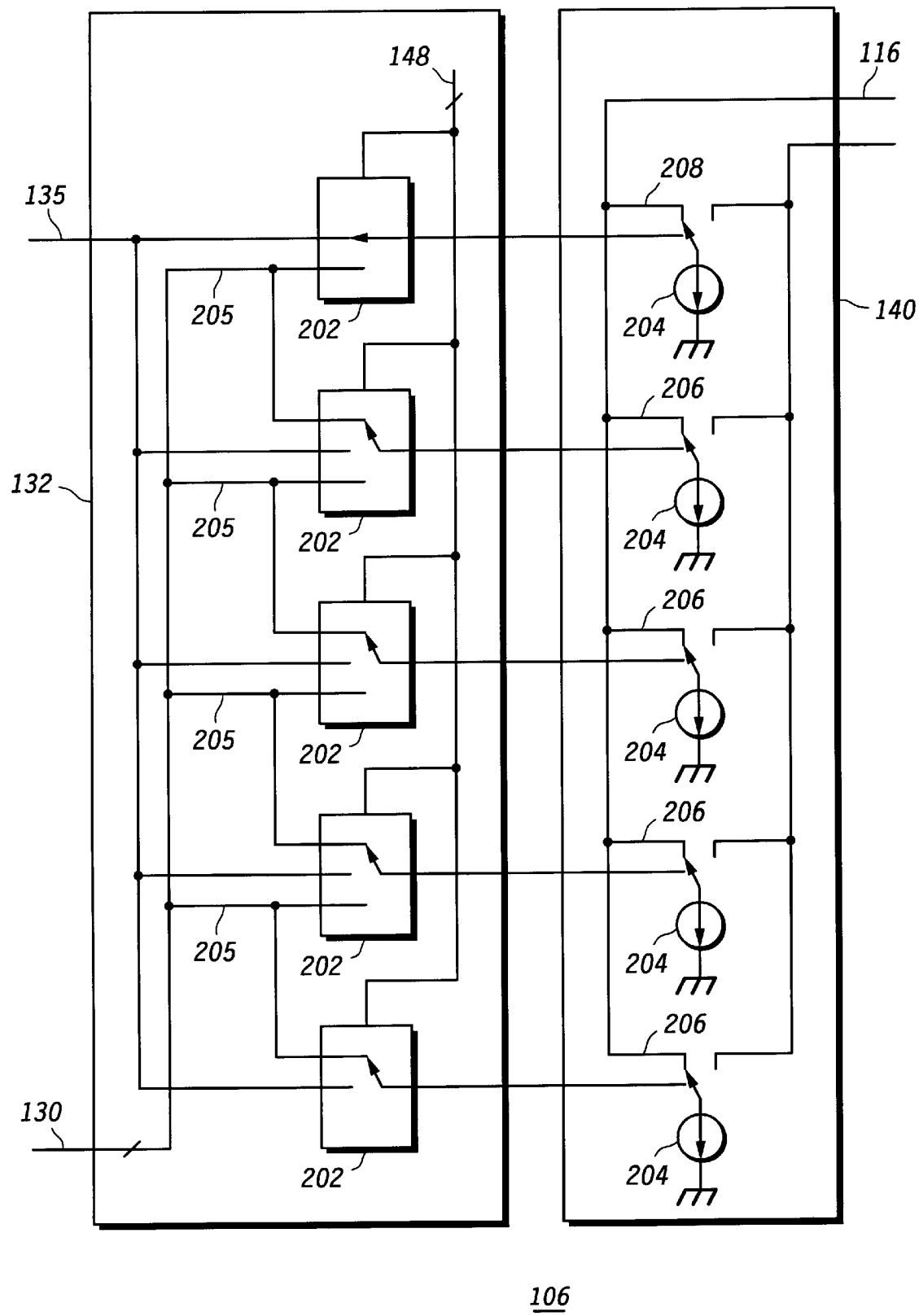
FIG. 2 is a block diagram of a selection device and feedback converter of the sigma-delta modulator of FIG. 1 in accordance with one embodiment of the invention.

Still referring to FIG. 1, feedback analog-to-digital converter 140 receives intermediate multi-bit signal 138 and outputs analog feedback signal 116 to arithmetic device 114. As described herein, analog feedback signal 116 comprises feedback portion 206 (FIG. 2) and reference portion 208 (FIG. 2). Feedback path 106 provides feedback portion 206 as a digital-to-analog conversion of return portion 205 (FIG. 2) of multi-bit digital signal 130. Reference portion 208 (FIG. 2) is output by feedback digital-to-analog converter 140 to allow determination by evaluator 142 of a conversion characteristic of at least one converter element 204 of feedback digital-to-analog converter 140. At least one converter element 204 of feedback digital-to-analog converter 140 is selected by selection device 132 for determination of the conversion characteristic, as described herein.

Referring further to FIG. 1, evaluator 142 receives multi-bit digital signal 130 from primary analog-to-digital converter 124. Also, evaluator 142 receives reference signal 135 from reference device 136. Evaluator 142 determines a conversion characteristic of at least one converter element 204 of feedback digital-to-analog converter 140 as selected by selection device 132. In one example, evaluator 142 outputs the conversion characteristic of at least one converter element 204 as calibration value 144.

Referring still to FIG. 1, another example of evaluator 142 receives a signal other than multi-bit digital signal 130. For instance, instead of multi-bit digital signal 130 evaluator 142 can receive a different signal in primary path 104 or a signal in feedback path 106. Evaluator 142 can use this signal with reference signal 135 to determine a conversion characteristic of at least one converter element 204, as will be appreciated by those skilled in the art.

Further referring to FIG. 1, one example of evaluator 142 can determine a conversion characteristic of at least one converter element 204 without receiving reference signal 135. For instance, evaluator 142 can determine the conversion characteristic of the at least one converter element 204 using prior knowledge of a characteristic of reference indicator 134, as will be understood by those skilled in the art. As one example of such a characteristic of reference indicator 134, prior knowledge of the frequency spectrum of the reference signal 135 would allow one to create a digital filter which would detect the known frequency components and reject or attenuate all others.

Again referring to FIG. 1, calibration value 144 is received by correction device 146. Correction device 146 comprises a memory. In addition, correction device 146 receives multi-bit digital signal 130 from primary analog-to-digital converter 124. Further, correction device 146 receives selection signal 148 from selection device 132. In one example, selection device 132 comprises circuitry for generating selection signal 148. Selection signal 148 received from selection device 132 allows correction device 146 to store calibration value 144 in a memory location corresponding to converter element 204 of feedback digitalto-analog converter 140 which is selected by selection device 132. Correction device 146 outputs digital output signal 112 to output port 108. Output port 108 transmits digital output signal 112 to, for instance, a digital filter (not shown), as will be understood by those skilled in the art.

Referring further to FIG. 1, one example of correction device 146 stores calibration value 144 for each converter element 204 (FIG. 2). For example, sigma-delta modulator 100 can continuously evaluate ones or subsets of converter elements 204 to cover all the converter elements 204. This coverage can be, for example, serial, cyclic, or staggered. Further, one or multiple of converter elements 204 can be evaluated in parallel. In another example, correction device 146 stores an overall calibration value for each combination or subset of converter elements 204 used in sigma-delta modulator 100 for digital-to-analog conversion. For instance, correction device 146 can comprise an arithmetic unit such as an adder (not shown), as will be appreciated by those skilled in the art.

Turning to FIG. 2, one example of selection device 132 comprises a selection multiplexor comprising plurality of multiplexor elements 202 for selecting at least one of a plurality of converter elements 204 of feedback digital-to-analog converter 140. In one example, converter elements 204 comprise a plurality of current sources, as represented in FIG. 2. In another example, converter elements 204 comprise a plurality of capacitors (not shown), as will be understood by those skilled in the art.

In one example, again referring to FIG. 2, plurality of converter elements 204 comprise a plurality of unit elements. For instance, converter elements 204 as unit elements can be segmented and/or of substantially equal value. In another example, plurality of converter elements 204 can be weighted, such as with binary weighting, as will be understood by those skilled in the art. For explanatory purposes, the description herein emphasizes an implementation of converter elements 204 as unit elements.

In one embodiment, still referring to FIG. 2, plurality of converter elements 204 of feedback digital-to-analog converter 140 number one more than the number of digital control signals in return portion 205 of multi-bit digital signal 130 which is arranged to be convened to analog form as feedback portion 206 of feedback analog signal 116. For instance, one of converter elements 204 can serve as a substitute converter element 204 for another of converter elements 204 selected by selection device 132 with selection signal 148. The selection of converter element 204 as directed by selection signal 148 from selection device 132 causes a conversion characteristic of the selected converter element 204 to be determined by evaluator 142. One example of such a conversion characteristic of the selected converter element 204 is the magnitude of the contribution by the selected converter element 204 to the output current of a current made digital-to-analog converter.

For explanatory purposes, FIG. 2 illustrates an exemplary selection of top converter element 204 for determination of its conversion characteristic in calibration of the top converter element 204. Selection device 132 provides selection signal 148 to top multiplexor element 202 corresponding to top converter element 204. Selection signal 148 causes top multiplexor element 202 to receive reference signal 135 for transmission to top converter element 204 of reference signal 135 from top multiplexor element 202. In this example, four digital control signals comprise return portion 205 of multi-bit digital signal 130 to be converted to analog form by the lower four converter elements 204 in outputting feedback portion 206 of feedback signal 116.

Referring to FIG. 2, the digital-to-analog conversion of return portion 205 of multi-bit digital signal 130 in feedback path 106 (FIG. 1) by converter elements 204 is contemporaneous with the analog-to-digital conversion in primary path 104 (FIG. 1) of shaped analog signal 122. The digital-to-analog conversion of return portion 205 of multi-bit digital signal 130 is concurrent with the analog-to-digital conversion in primary path 104 of shaped analog signal 122. Top converter element 204 is selected by selection device 132 for determination of its conversion characteristic by evaluator 142 (FIG. 1). So, the digital control signal from return portion 205 of multi-bit digital signal 130 preliminarily arranged to be converted by top converter element 204 is contemporaneously converted instead by the next lower converter element 204 per direction of selection signal 148 provided to multiplexor elements 202, as can be understood through examination of FIG. 2.

Still referring to FIG. 2, feedback signal 116 output by converter elements 204 of feedback digital-to-analog converter 140 comprises feedback portion 206 and reference portion 208. Feedback portion 206 of analog feedback signal 116 is provided through a digital-to-analog conversion by the lower four converter elements 204 which receive return portion 205 of multi-bit digital signal 130 through the lower four multiplexor elements 202 per control by selection signal 148 provided to the plurality of multiplexor elements 202. Reference portion 208 of analog feedback signal 116 is provided by a digital-to-analog conversion performed by top converter element 204 of reference signal 135 received from top multiplexor element 202 per selection signal 148.

In one example, referring again to FIG. 2, return portion 205 of multi-bit digital signal 130 is passed from the lower four multiplexor elements 202 of selection device 132 to the lower four converter elements 204 of feedback digital-to-analog converter 140 contemporaneously and/or concurrently with the analog-to-digital conversion in primary path 104 (FIG. 1) of shaped analog signal 122. The digital-to-analog conversion of return portion 205 of multi-bit digital signal 130 by the lower four converter elements 204 occurs contemporaneously and/or concurrently with the analog-to-digital conversion in primary path 104 of shaped analog signal 122. Reference signal 135 is passed from top multiplexor element 202 of selection device 132 to top converter element 204 of feedback digital-to-analog converter 140 contemporaneously and/or concurrently with the analog-to-digital conversion in primary path 104 of shaped analog signal 122 and/or contemporaneously and/or concurrently with the passing of return portion 205 of multi-bit digital signal 130 from the lower four multiplexor elements 202 to the lower four converter elements 204. The converting of reference signal 135 by top converter element 204 to provide reference portion 208 of analog feedback signal 116 occurs contemporaneously and/or concurrently with the analog-to-digital conversion in primary path 104 of shaped analog signal 122 and/or the digital-to-analog conversion by the lower four converter elements 204 of return portion 205 of the multi-bit digital signal 130 to provide feedback portion 206 of analog feedback signal 116.

Referring to FIG. 2, any converter element 204 can be employed to provide feedback portion 206 or reference portion 208 at various times and temporally coordinated with any other signal and/or converter element 204 and/or other component, as will be appreciated by those skilled in the art.

As one advantage, the analog-to-digital conversion of analog difference signal 118 in primary path 104 continues while signal passing and/or conversion for determination of a conversion characteristic of at least one converter element 204 occurs. As another advantage, the determination of the conversion characteristic of the converter elements 204 accounts and/or adjusts for environmental conditions which adversely affect and/or alter performance of any one or more parts of sigma-delta modulator 100. As yet another advantage, multiplexors 202 present decreased and/or minimal circuitry and time delay for signal conversion by the selection device 132 and feedback digital-to-analog converter 140 in feedback path 106.

Now referring to FIGS. 1–2, one example of reference indicator 134 comprises a digital sequence of 1, −1, 1, −1, etc. Using this digital sequence as reference indicator 134, reference device 136 generates reference signal 135 at the rate of clock signal 126 from sampling clock 128. This results in a component of reference signal 135 at one half the frequency of clock-signal 126, as will be understood by those skilled in the art. So, reference portion 208 of analog feedback signal 116 is located in the frequency spectrum of analog feedback signal 116 at one half the frequency of sampling clock 128. In one example, reference indicator 134 causes reference portion 208 to have harmonic frequencies distinct from frequency content of input signal 110. Design choice allows selection of any reference indicator 134 for any location of reference portion 208 in the frequency spectrum, as will be understood by those skilled in the art.

Figure 3:
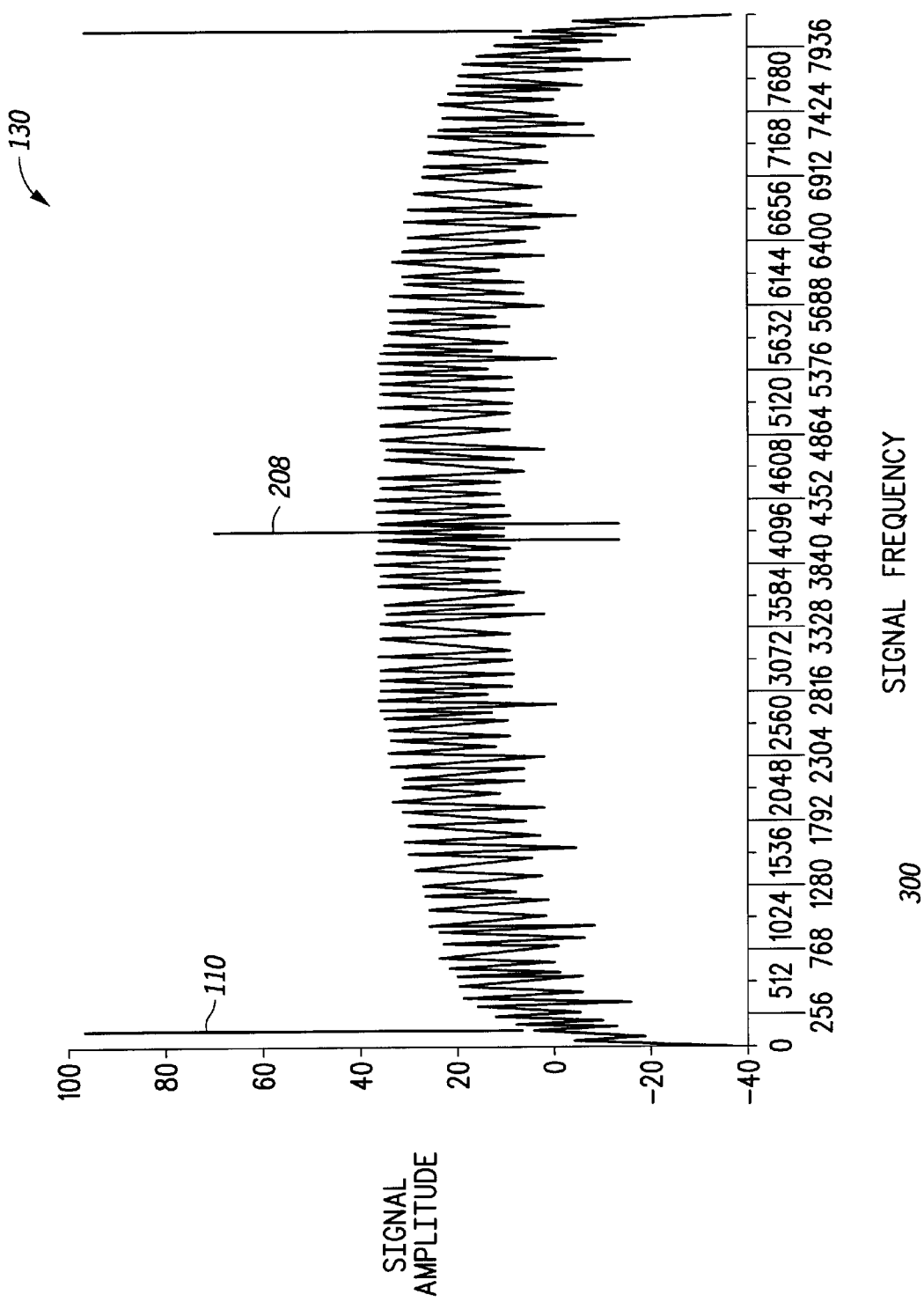
FIG. 3 is a plot of an output signal spectrum of the sigma-delta modulator of FIG. 1 in accordance with one embodiment of the invention.

Turning to FIG. 3, plot 300 illustrates a frequency spectrum which is the result of a fast fourier transform ("FFT") of the signal represented by multi-bit digital signal 130 (FIG. 1). For illustrative purposes, plot 300 depicts signal amplitude in units of dBV versus signal frequency in units of Hertz. The right end of the horizontal axis corresponds to the sampling frequency and, as is typical of FFT plots, the illustrated spectrum is symmetric about an imaginary line drawn vertically through the midpoint of the horizontal axis, as will be appreciated by those skilled in the art. In one example, reference portion 208 of feedback signal 116 is included in shaped analog signal 122. Reference portion 208 is illustrated as appearing in multi-bit digital signal 130 at one half the frequency of clock signal 126 (FIG. 1) of sampling clock 128. The tall spike near the left end, and a reflected image of that tall spike located near the right end of plot 300 represent a frequency component of analog input signal 110. The occurrence of this frequency component of analog input signal 110 in multi-bit digital signal 130 results from operation of primary path 104 coupled with feedback path 106, as will be appreciated by those skilled in the art.

Referring to FIGS. 1–3, shaped analog signal 122 comprising analog input signal 110 and reference portion 208 is converted by primary analog-to-digital converter 124 to digital form for passing to evaluator 142 as multi-bit digital signal 130. Evaluator 142 employs reference signal 135 to evaluate a portion of multi-bit digital signal 130 corresponding to reference portion 208. Through this employment of reference signal 135, evaluator 142 can determine a conversion characteristic of the selected converter element 204 of feedback digital-to-analog converter 140. For instance, this selected converter element 204 can comprise top converter element 204. The selection is made with selection signal 148 passed to multiplexors 202.

Figure 4:
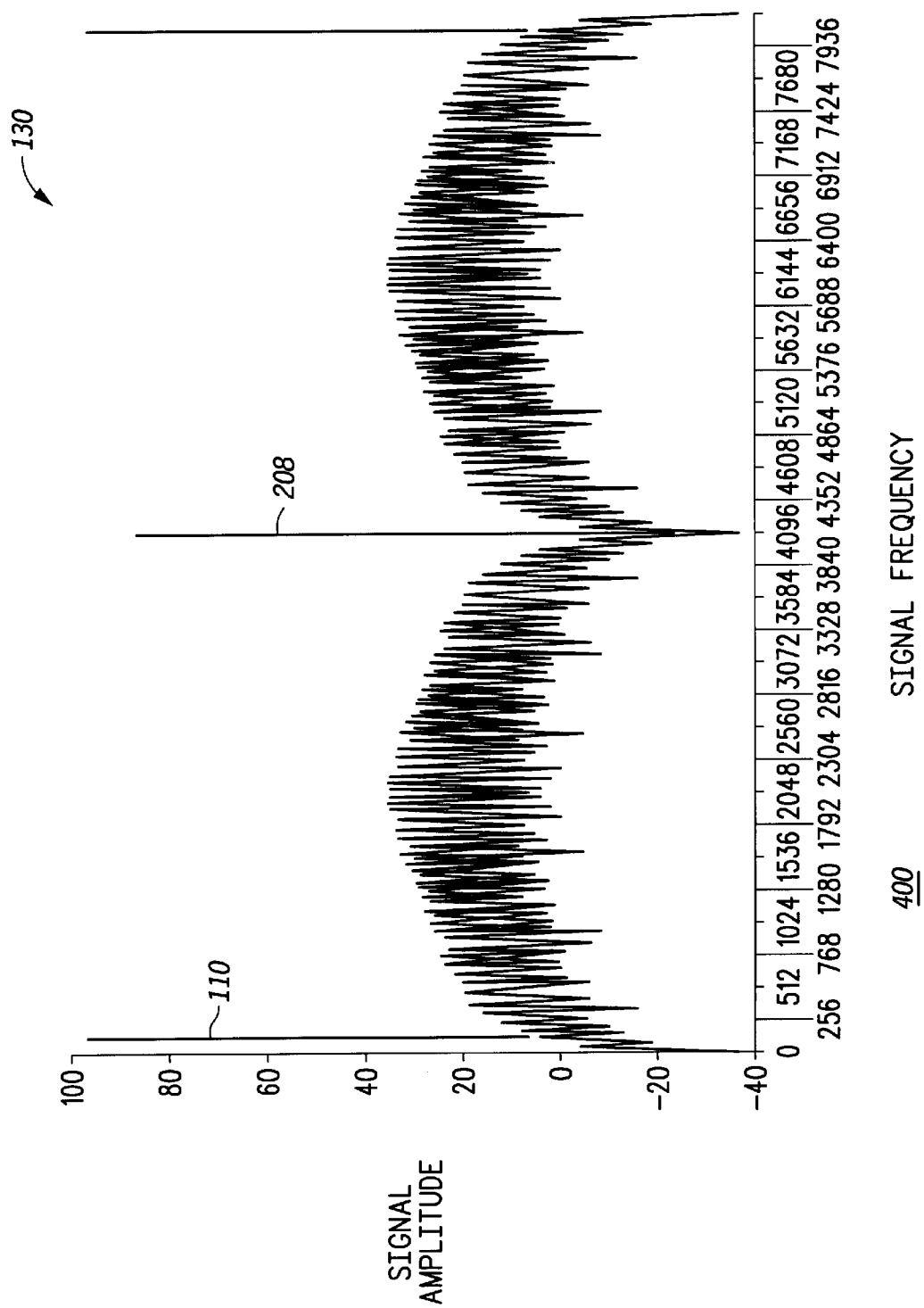
FIG. 4 is a plot of an output signal spectrum for the sigma-delta modulator of FIG. 1 in accordance with another embodiment of the invention.

Turning to FIG. 4, plot 400 illustrates a frequency spectrum of multi-bit digital signal 130 (FIG. 1). Plot 400 is similar to plot 300. However, plot 400 illustrates additional noise filtering at the frequency of reference portion 208. This additional filtering results from a selected implementation of noise-shaping filter 120 (FIG. 1), as will be appreciated by those skilled in the art. The filtering of a signal along primary path 104 serves to advantageously decrease interference with reference portion 208, as will be appreciated by those skilled in the art.

Turning to FIG. 5, table 500 presents exemplary values over time at various locations in sigma-delta modulator 100 (FIG. 1). For instance, the time increments in table 500 can be two hundred nanoseconds. The columns of table 500 are headed by reference numerals corresponding to locations in sigma-delta modulator 100 illustrated in FIG. 1. As shown in table 500, calibration value 144 for selected converter element 204 (FIG. 2) relatively quickly arrives at the correct value of in one example, 0.48.

Figure 6:
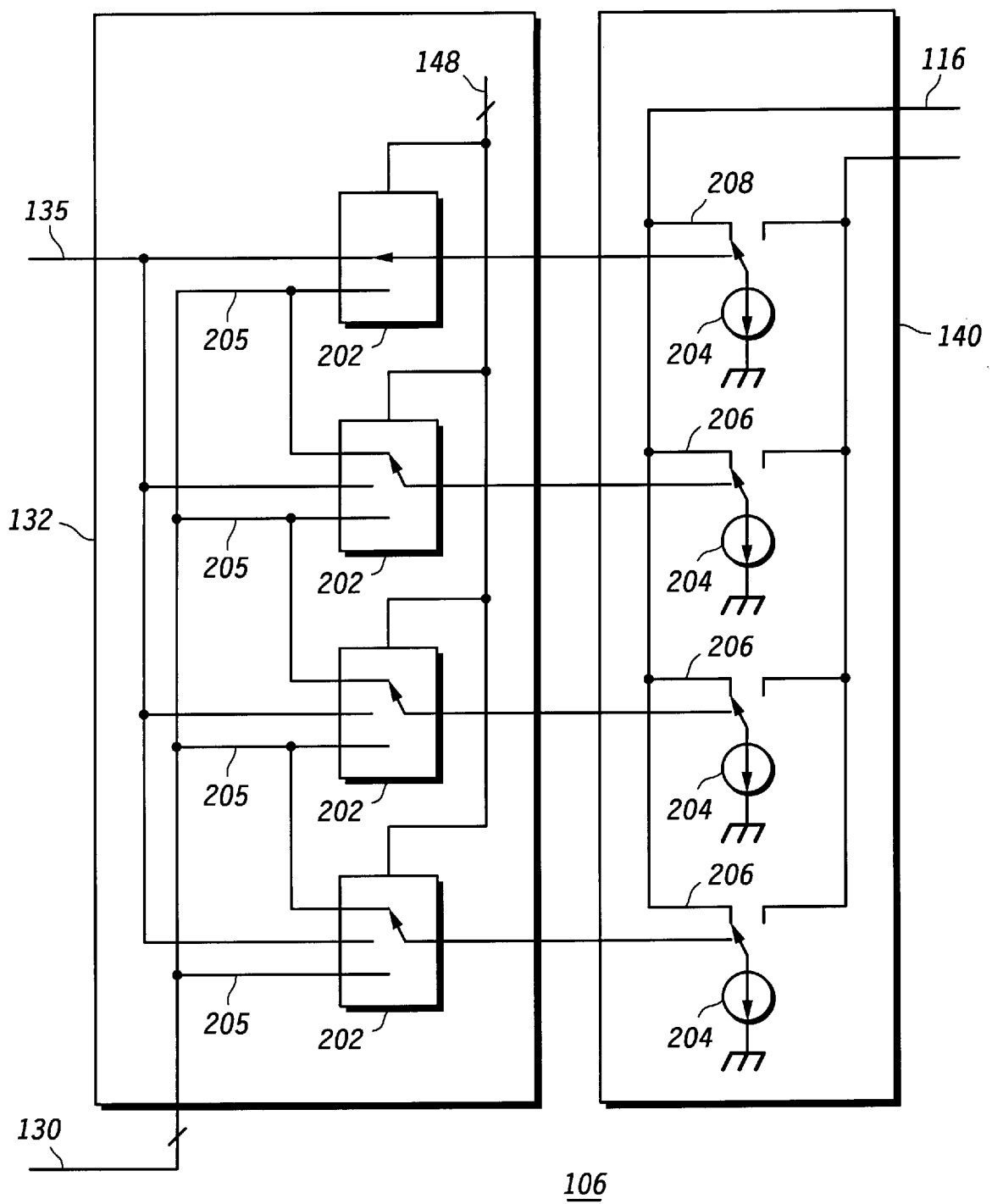
FIG. 6 is a block diagram of a selection device and feedback converter of the sigma-delta modulator of FIG. 1 in accordance with another embodiment of the invention.

Turning to FIG. 6, another example of selection device 132 and feedback digital-to-analog converter 140 is illustrated. This selection device 132 and feedback digital-to-analog converter 140 differ from selection device 132 and digital-to-analog converter 140 of FIG. 2 by omitting the extra converter element 204. In FIG. 6, one digital control line of return portion 205 is not converted by a converter element 204. For instance, that digital control line of return portion 205 not converted is selected to be a most-significant digital control line or a least-significant digital control line, as will be understood by those skilled in the art. The selection of the digital control line not converted is strategically made for promoting the overall accuracy of sigma-delta modulator 100, as will be appreciated by those skilled in the art. In another example, any digital control line of return portion 205 may be selected to be omitted from conversion by converter element 204.

Figure 7:
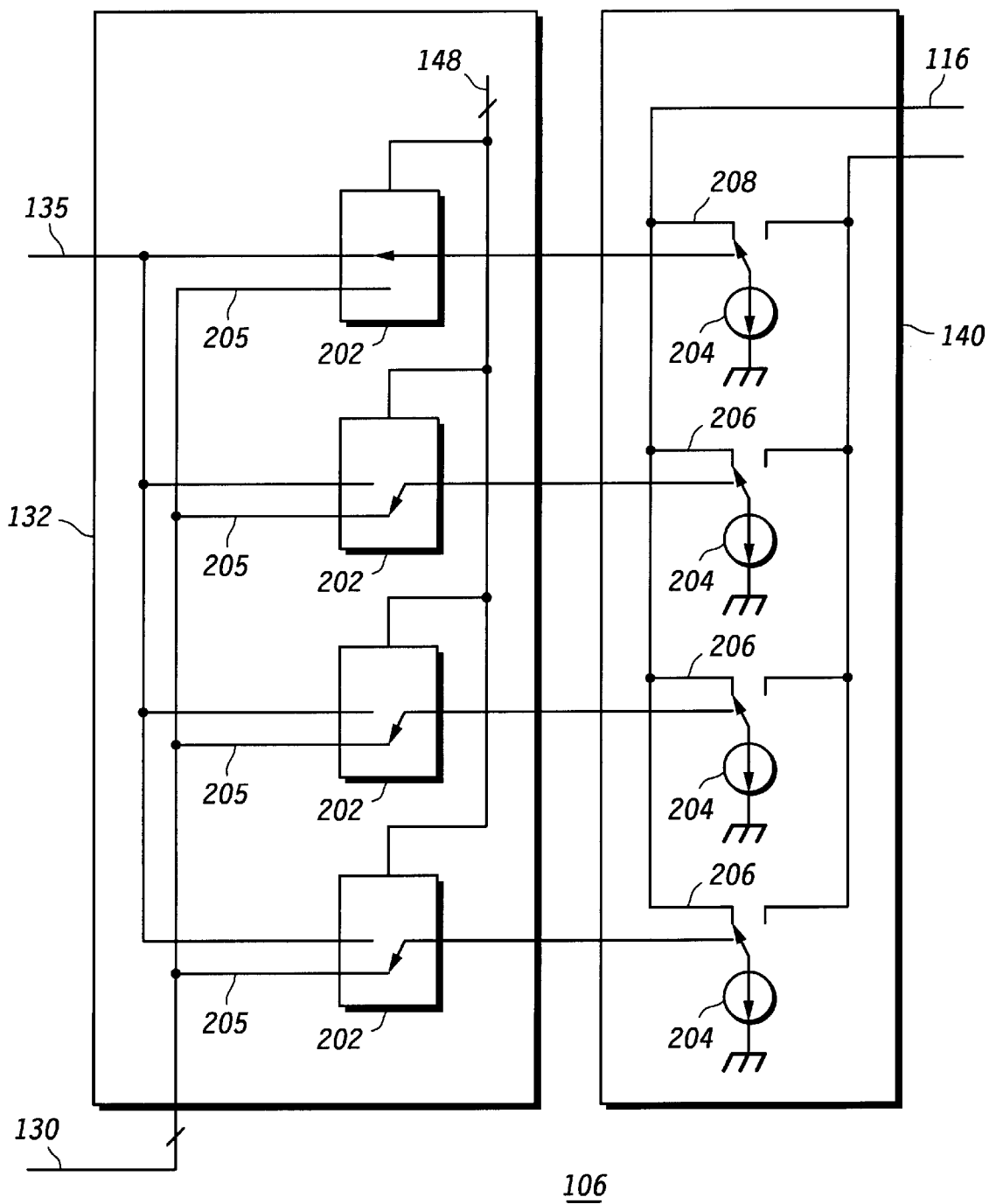
FIG. 7 is a block diagram of a selection device and feedback converter of the sigma-delta modulator of FIG. 1 in accordance with a further embodiment of the invention.

Turning to FIG. 7, a further example of selection device 132 and feedback digital-to-analog converter 140 is illustrated. The embodiment illustrated in FIG. 7 employs optional correction circuitry 702 (FIG. 1) in correction device 146 to correct for the omission of the extra converter element 204 depicted in FIG. 2. Referring to FIG. 7, a selected converter element 204 is selected for determination of its conversion characteristic. That selected converter element 204 does not participate in converting return portion 205 of multi-bit digital signal 130 to feedback portion 206 of feedback analog signal 116. Similar design choices concerning a digital control line of return portion 205 not convened may be made as described herein with reference to FIG. 6. Optional correction circuitry 702 (FIG. 1) is employed to correct for this omission, as will be appreciated by those skilled in the an. In one example, optional correction circuitry 702 receives multi-bit digital signal 130 and selection signal 148 and makes a correction in digital output signal 112. For instance, nonoccurrence of a conversion of one digital control line of return portion 205 can present an error in feedback path 116, with correction circuitry 702 advantageously serving to correct, counteract, and/or decrease the impact of the error.

Figure 8:
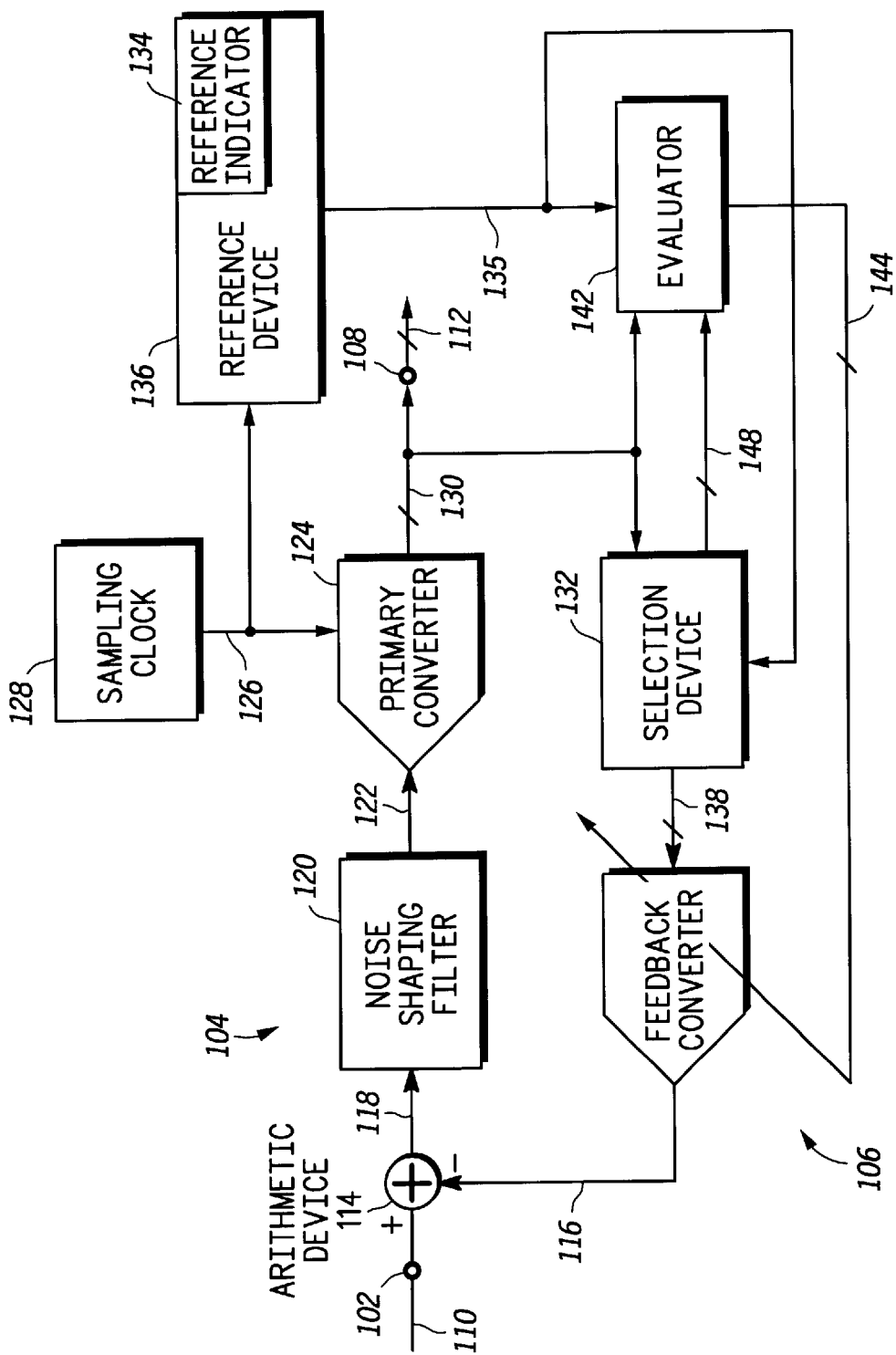
FIG. 8 is a block diagram of a signal converter as a sigma-delta modulator in accordance with another embodiment of the invention.

Turning to FIG. 8, another example of sigma-delta modulator 100 is illustrated. Sigma-delta modulator 100 illustrated in FIG. 8 differs from sigma-delta modulator 100 illustrated in FIG. 1 by, for instance, omitting correction device 146. Sigma-delta modulator 100 illustrated in FIG. 8 employs evaluator 142 and feedback digital-to-analog converter 140 comprising elements 204 which can be trimmed or dynamically adjusted by calibration value 144, as will be understood by those skilled in the an. For instance, a conversion characteristic of at least one converter element 204 can be adjusted based on a corresponding calibration value determined for the at least one converter element 204.

While the invention has been particularly shown and described with reference to a particular embodiment, it will be understood by those skilled in the art that various changes in form and details may be made therein without departing from the spirit and scope of the invention and it is intended that all such changes come within the scope of the following claims.

What is claimed is:

1. A method of continuously converting an input signal to an output signal across a primary path of a signal converter, a primary converter along the primary path outputs a return signal to a feedback path of the signal converter and a feedback converter along the feedback path outputs a feedback signal to the primary path, the method comprising the steps of:

employing a reference indicator to provide a digital reference signal;

passing the digital reference signal to an element of the feedback converter for outputting a reference portion of the digital feedback signal contemporaneous with the converting of the input signal to the output signal; and determining a conversion characteristic of the element by employing a characteristic of the reference indicator.

2. The method of claim 1 wherein the step of determining the conversion characteristic of the element comprises the step of determining the conversion characteristic of the element by employing the characteristic of the reference indicator to evaluate the output signal.

3. The method of claim 1 wherein the step of determining the conversion characteristic of the element comprises the step of determining the conversion characteristic of the element by employing the characteristic of the reference indicator to evaluate a signal in the signal converter.

4. The method of claim 1 wherein the element comprises a first element of the feedback converter, and further comprising the step of passing a portion of the return signal to a second element of the feedback converter for outputting a feedback portion of the feedback signal, wherein the step of passing the portion of the return signal to the second element is contemporaneous with the step or passing the digital reference signal to the first element of the feedback converter.

5. The method of claim 1 wherein the step of determining the conversion characteristic of the element is contemporaneous with the converting of the input signal to the output signal.

6. The method of claim 1 wherein the element comprises a first element of the feedback converter, and further comprising the step of passing the digital reference signal to a second element of the feedback converter for outputting a reference portion of the feedback signal, wherein the step of passing the digital reference signal to the second element is contemporaneous with the converting of the input signal to the output signal.

7. The method of claim 6 further comprising the step of determining a conversion characteristic of the second element by employing the characteristic of the reference indicator.

8. The method of claim 6 wherein the step of passing the digital reference signal to the second element is contemporaneous with the step of passing the digital reference signal to the first element.

9. The method of claim 6 wherein the step of passing the digital reference signal to the second element is nonconcurrent with the step of passing the digital reference signal to the first element.

10. The method of claim 1 wherein the element comprises a first element of the feedback converter, wherein the first element is preliminarily arranged to perform a conversion of a return portion of the return signal, and further comprising the step of substituting a second element of the feedback converter for the first element to perform the conversion of the return portion of the return signal.

11. The method of claim 10 further comprising the step of passing the return portion of the return signal to the second element contemporaneously with the step of passing the digital reference signal to the first element.

12. The method of claim 1 wherein the reference indicator comprises a modulating sequence for distinguishing the reference portion from the input signal.

13. The method of claim 12 wherein the step of employing the reference indicator to provide the digital reference signal comprises the step of employing the modulating sequence with a sampling clock signal for the primary path to provide the digital reference signal.

14. The method of claim 1 wherein the step of employing the reference indicator to provide the digital reference signal and the step of passing the digital reference signal to the element of the feedback converter for outputting the reference portion of the feedback signal comprise the step of causing the reference portion of the feedback signal to have a characteristic distinct from a characteristic of the input signal.

15. The method of claim 1 wherein the step of employing the reference indicator to provide the digital reference signal and the step of passing the digital reference signal to the element of the feedback converter for outputting the reference portion of the feedback signal comprise the step of causing the reference portion of the feedback signal to have harmonic frequencies distinct from frequency content of the input signal.

16. The method of claim 1 wherein the step of determining the conversion characteristic of the element comprises the step of determining a calibration value for the element.

17. The method of claim 16 further comprising the step of storing the calibration value in a memory.

18. The method of claim 16 wherein the step of determining the conversion characteristic of the element comprises the step of identifying the conversion characteristic of the element, and further comprising the step of adjusting a conversion characteristic of the feedback converter based on the calibration value for the element.

19. The method of claim 1 further comprising the step of filtering a primary signal along the primary path to decrease interference with the reference portion of the feedback signal.

20. The method of claim 1 further comprising the step of passing the reference signal to a plurality of elements of the feedback converter in a non-sequential order of the plurality of elements.

21. The method of claim 1 wherein the element is preliminarily arranged to perform a conversion of a return portion of the return signal, and further comprising the step of withholding the return portion from the element concurrent with the step of passing the reference signal to the element.

22. The method of claim 21 wherein the step of withholding the return portion from the element occurs under a nonoccurrence of a conversion of the return portion, wherein the nonoccurrence presents an error, and further comprising the step of employing correction circuitry to decrease the error.

23. A system used in continuously converting an input signal to an output signal across a primary path of a signal converter, the signal converter having a primary converter along the primary path which outputs a return signal to a feedback path of the signal converter and a feedback converter along the feedback path which outputs a feedback signal to the primary path, the system comprising:

a reference device that employs a reference indicator to provide a digital reference signal;

a selection device that passes the digital reference signal to an element of the feedback converter for outputting a reference portion of the feedback signal contemporaneous with the converting of the input signal to the output signal; and an evaluator that determines a conversion characteristic of the element by employing a characteristic of the reference indicator.

24. The system of claim 23 wherein the evaluator determines the conversion characteristic of the element by employing the characteristic of the reference indicator to evaluate the output signal.

25. The system of claim 23 wherein the evaluator determines the conversion characteristic of the element by employing the characteristic of the reference indicator to evaluate a signal in the signal converter.

26. The system of claim 23 wherein the element comprises a first element of the feedback converter, wherein the selection device passes a portion of the return signal to a second element of the feedback converter for outputting a feedback portion of the feedback signal, and wherein the selection device passes the portion of the return signal to the second element contemporaneously with the selection device passing the digital reference signal to the first element of the feedback converter.

27. The system of claim 23 wherein the evaluator determines the conversion characteristic of the element contemporaneously with the converting of the input signal to the output signal across the primary path.

28. The system of claim 23 wherein the element comprises a first element of the feedback converter, wherein the selection device passes the digital reference signal to a second element of the feedback converter for outputting a reference portion of the feedback signal, and wherein the selection device passes the digital reference signal to the second element contemporaneously with the converting of the input signal to the output signal across the primary path.

29. The system of claim 28 wherein the evaluator determines a conversion characteristic of the second element by employing the characteristic of the reference indicator.

30. The system of claim 28 wherein the selection device passes the digital reference signal to the second element contemporaneously with the selection device passing the digital reference signal to the first element.

31. The system of claim 28 wherein the selection device passes the digital reference signal to the second element nonconcurrently with the selection device passing the digital reference signal to the first element.

32. The system of claim 23 wherein the element comprises a first element of the feedback converter, wherein the first element is preliminarily arranged to perform a conversion of a return portion of the return signal, and wherein the selection device employs a second element of the feedback converter as a substitute for the first element to perform the conversion of the return portion of the return signal.

33. The system of claim 32 wherein the selection device passes the return portion of the return signal to the second element contemporaneously with the selection device passing the digital reference signal to the first element, and wherein the second element serves as the substitute for the first element to perform the conversion of the return portion.

34. The system of claim 23 wherein the reference indicator comprises a modulating sequence, and wherein the evaluator employs a characteristic of the modulating sequence to distinguish the reference portion from the input signal.

35. The system of claim 34 wherein the evaluator employs the modulating sequence with a sampling clock signal for the primary path to provide the digital reference signal.

36. The system of claim 23 wherein the digital reference signal passed by the selection device to the element causes the reference portion of the feedback signal output from the element to have a characteristic distinct from a characteristic of the input signal.

37. The system of claim 23 wherein the digital reference signal passed by the selection device to the element causes the reference portion of the feedback signal output from the element to have harmonic frequencies distinct from frequency content of the input signal.

38. The system of claim 23 wherein the conversion characteristic comprises a calibration value for the element, and wherein the evaluator determines the calibration value for the element.

39. The system of claim 38 further comprising a memory that stores the calibration value.

40. The system of claim 38 wherein the feedback converter comprises a dynamic feedback converter, and wherein the conversion characteristic of the element is adjusted based on the calibration value.

41. The system of claim 23 wherein the primary path comprises a filter that filters a primary signal along the primary path to decrease interference with the reference portion of the feedback signal.

42. The system of claim 23 wherein the selection device passes the digital reference signal to a plurality of elements of the feedback converter in a non-sequential order of the plurality of elements.

43. The system of claim 23 wherein the element is preliminarily arranged to perform a conversion of a return portion of the return signal, and wherein the selection device withholds the return portion from the element concurrent with the selection device passing the digital reference signal to the element.

44. The system of claim 43 wherein a nonoccurrence of the conversion of the return portion presents an error in the output signal, and further comprising correction circuitry for decreasing the error.

* * * * *